(12) United States Patent
Fusco

(10) Patent No.: US 6,308,292 B1
(45) Date of Patent: Oct. 23, 2001

(54) FILE DRIVEN MASK INSERTION FOR AUTOMATIC TEST EQUIPMENT TEST PATTERN GENERATION

(75) Inventor: Gene T. Fusco, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/207,191

(22) Filed: Dec. 8, 1998

(51) Int. Cl.[7] .................................................. G06F 11/00
(52) U.S. Cl. ............................................. 714/738; 703/22
(58) Field of Search ................................... 714/741, 745, 714/738, 736, 733, 734, 724, 32, 33, 31; 703/21, 22, 14, 13

(56) References Cited

U.S. PATENT DOCUMENTS

| | | |
|---|---|---|
| 4,313,200 | 1/1982 | Nishiura ................................. 371/25 |
| 4,497,056 | 1/1985 | Sugamori ............................... 371/25 |
| 5,377,203 | 12/1994 | Khan ..................................... 371/27 |
| 5,390,193 | 2/1995 | Millman et al. ....................... 371/27 |
| 5,701,309 | * 12/1997 | Gearhardt et al. ................... 714/736 |
| 5,737,340 | 4/1998 | Tamarapalli et al. ............... 371/22.5 |
| 5,745,501 | 4/1998 | Garner et al. ......................... 371/27 |
| 5,815,513 | * 9/1998 | Hiraide ................................. 714/741 |

* cited by examiner

*Primary Examiner*—Christine T. Tu

(57) ABSTRACT

A method, system, and program for selectively testing output signals of an integrated circuit. The system comprising a mask generation file specifying output signals and test cycles and a verification module to check simulation output data and generate test pattern data. The verification module further comprising an extractor routine which receives the mask generation file and processes the simulation output data such that the test pattern data is coded to mask the specified output signals at the specified test cycles. The verification module further comprising margin analysis for determining if margin times of the coded test patterns fall below a minimum margin time setting.

22 Claims, 6 Drawing Sheets

FILE DRIVEN MASK INSERTION FOR AUTOMATIC TEST EQUIPMENT TEST PATTERN GENERATION

BACKGROUND OF THE INVENTION

1. Field of the Invention

This invention relates to error detection of a semiconductor device, and more particularly to generating a test pattern for testing systems.

2. Description of Related Art

Microelectronic integrated circuits (ICs), such as computer chips, are used in a variety of products including personal computers, automobiles, communication systems, and consumer electronics products. Typically, an IC contains millions of microscopic electrical components and is fabricated on wafers of silicon. As the popularity of ICs has increased, techniques for designing ICs, such as Computer Aided Design (CAD), have become simpler and more economical.

The lowered cost of designing ICs allows smaller high-tech companies to create their own custom made, or Application Specific ICs (ASICs), instead of using "off-the-shelf" generic IC packages. While many large scale businesses can afford the necessary equipment to manufacture their ICs, a small company often does not have such equipment. These businesses often create IC designs in-house and send their designs to an IC manufacturer who then fabricates, packages, and tests the IC. The process of creating ICs can therefore be divided into two separate tasks, design and manufacturing.

FIG. 1 illustrates a division between designing steps 101 and manufacturing steps 103 of IC production. The designer first abstracts the design using circuit design tools 105. Circuit design tools typically allow the user to design a circuit using a top-down approach. The user starts the design with a high level functional description of the circuit and gradually works down to a lower register and gate level design representation. A top-down approach greatly simplifies the design process, enabling the engineer to concentrate on functional aspects of the design without having to worry about low-level circuit theory and device physics details.

The circuit design tools 105 typically generate circuit design files 107 and simulation files 109. The design files 107 contain detailed information about analog and digital component interconnections, and are used in preparation of IC fabrication by the manufacturer. The simulation files 109 include a circuit description and simulation data used by a fault simulator and verification tools 111, for example.

The design files 107 are received by the manufacturer's process tools 117 to define the physical layout and testing of the IC. The process tools 117 then generate process programs used by IC manufacturer's equipment. Fabrication 119 involves multiple stages of chemical and physical processing to create the actual IC having, for example, solid state transistors, solid state resistors, input/output pads, metal interconnections and so on. The fabricated IC 121 is encapsulated in plastic, ceramic, or other material according the designer's specifications.

The simulation files 109 include time sets used to create strobe signals. Strobes determine the time within each test cycle the manufacturer's test equipment 115, such as an automatic test equipment (ATE) system, collects data from the IC's output signals. The simulation files 109 also include a circuit description, such as a circuit netlist or a Register Transfer Level (RTL) description, which is input into the simulator 111. A netlist is typically a list of electronic logic cells with a description of the connections between the inputs and the outputs of the various logic cells. An RTL description describes the functionality of the circuit, much like programming source code is a description of the functionality of a software program.

Simulation permits the designer to test whether a particular design works before it is built. By using mathematical models for physical devices, a simulator can provide simulated best and worst case output results for a given input stimulus. Input stimulus represents a set of input signals required to drive specific functional aspects of the circuit during simulation. Generally, the input stimulus used in circuit simulation is created by the designer to simulate operation of the circuit design embodied in the design representation. The input stimulus is primarily based on anticipated real world conditions (e.g., the conditions of an IC found in a cellular phone) and on requirements for properly exercising particular functional blocks within the circuit. By comparing simulation results with expected simulation output, the designer can make sure his or her design works in anticipated real world conditions before actually building the IC.

A verification step further analyzes the simulation results and generates test files 113. The test files 113 generally include test patterns and margin analysis data. Test patterns contain both IC input patterns and IC output patterns used by the manufacturer's test equipment 115, such as an automatic test equipment (ATE) system. An IC input pattern is similar to simulation input stimulus and is used by the ATE system to drive input signals of the IC under test. An IC output pattern is similar to expected simulation output and is used to check the results from output signals of the IC under test.

An ATE system checks an IC by strobing the IC's output signals. The strobe signal allows the ATE system to collect IC output data from the output signal strobed. Data from the output signal is then compared with the output pattern in the test pattern to determine if the IC's output is correct. Crucial to this procedure is the output signal's "margin time."

Margin time is the time between an output signal's expected, or simulated, data change and the output signal's associated strobe signal. Generally, a left margin time is calculated for an output transition occurring before the strobe, and a right margin time is calculated for an output transition occurring after the strobe. A positive left or right margin time indicates the simulated output signal's best and worst case data transitions occur on the same side of a strobe signal's outer edge. In other words, a positive margin time indicates the output signal's best and worst case data edges occur on only one side of the strobe signal. Negative margin times indicate an output signal's best and worst case data transitions occur on different sides of a strobe signal edge, or within the strobe signal.

Negative margin times are undesirable because the output signal's state is unknown during strobe. For negative margin times, the IC's best and worst case simulation indicate a data transition can occur at a time either before, during, or after a strobe edge. A test pattern cannot be generated to check the IC's output state during strobe if negative margin times exist. Thus, a negative margin time will cause a signal to fail the verification step. Small positive margin times close to zero may also be undesirable even though they will not cause a verification failure. The closer an IC output signal's margin time is to zero, the closer the manufactured IC must behave to the ideal IC. Thus, if an actual IC having only a two nanosecond left margin time outputs data three nanoseconds past the expected output time, it will fail the associated test cycle.

Various design, manufacturing, and operational conditions can cause a manufactured IC's performance to deviate from its ideal performance. For example, an IC manufacturing process may require baking IC silicon wafers in a furnace for a length of time. The wafers at the ends of the furnace may be heated to a lower temperature than the wafers in the middle of the furnace, causing small process changes that can result in device operating characteristic differences, including timing variations. Thus, the time an IC takes to output valid data may vary by a few nanoseconds within a given lot. The smaller the margin time becomes for a given test pattern, the higher the failure rate will be due to inevitable IC timing variations.

Typically, an IC manufacturer tests the functionality of every IC after fabrication. ATE systems are high speed testers that can test hundreds of chips per hour. Like simulators, ATE systems input data into an IC and compare the output data to expected results. Unlike simulators, however, ATE systems test ICs in real-time using high speed electronic components to drive the input signals and read the output signals of the IC under test.

Inherent delays and tolerance errors within the ATE's electronic components typically require test engineers to periodically calibrate the ATE system so that actual input and output signal transitions occur as close to specified testing times as possible. To minimize the effects of calibration errors associated with ATE systems, it is useful to account for these variations during the verification step. A guardband can be added to either or both sides of the output strobe signal which extends the strobe width to account for any positive or negative calibration offsets in the ATE. For purposes of verification, data transition margin times are measured from the guardbanded strobe edges, not the actual strobe edges.

Verification tools may also generate a margin analysis report. Typically, a margin analysis report details the smallest margin times for each output signal, i.e., the shortest duration between a data output transition and a guardbanded strobe edge. If a calculated left or right margin time results in a negative number, verification fails and the offending output signal and the test cycle is reported.

ATE systems generally include a handler 123 and a tester 125. The handler 123 connects to input and output pins of the IC under test. The tester 125 controls the handler's 123 operations through a test program typically created by the manufacturer. The handler 123 sorts the good ICs 127 and bad ICs 129 according to whether they pass or fail the various tests in the test program.

Generally, a test program contains time critical test cycles and time non-critical test cycle. Time critical test cycles contain an IC output signal change that must occur within a short time period (typically less than a tester's test cycle) to ensure proper operation of the design. On the other hand, non-critical test cycles contain a change in an output signal's state which can occur over a larger time period (typically greater than a tester's test cycle) without compromising the design.

An IC output signal tested during a non-critical test cycle with a short margin time is often tested at stricter timing requirements than the designer's application requires. The output signal is strobed within a shorter than necessary time to guarantee the IC's proper operation in the intended application. For example, during a non-critical test cycle, a tester may strobe an output signal ten nanoseconds after an output request is made, but the exact time the output is passed by the IC is not crucial to the design. Valid output times exceeding ten nanoseconds may be acceptable to the designer, even though the IC will fail the test program if the output is not present within ten nanoseconds.

Non-critical test cycles with short margin times are therefore undesirable since there is a greater likelihood that timing drifts will cause an IC to fail during test, even though the IC would still meet the design's requirements. Thus, in order to increase the yield of acceptable ICs, the designer may not wish to test certain output signals during certain test cycles.

One solution in the prior art is for the designer create time sets with longer margin times for non-critical test cycles. However, since an ATE system's hardware can support only a limited number of time sets, the tester's capability to create special time sets for every non-critical test cycle can quickly be exceeded.

Another solution in the prior art is for the designer to "mask" output signals with non-critical test cycles and short margin times. Masking an output signal is accomplished by coding the expected output in a test pattern such that the tester does not compare the output signal with the expected data and always passes the masked output signal during the masked test cycle. A drawback to this approach is that it typically requires designers to hand edit test patterns, a time consuming and error prone task. Moreover, a margin analysis report may not provide the designer with information needed to find non-critical test cycles containing short margin times. Typically, a margin analysis report only gives the designer an output signal's shortest positive margin times. If the output signal does not have a negative margin time, test cycles are not mentioned in the report. Thus, the designer typically has no way of knowing whether the reported shortest margin times occurred during a critical or non-critical test cycle. Investigating every margin time for every test cycle may substantially increase test program development time.

Another solution in the prior art is for the manufacturer to mask output signals in non-critical test cycles with short margin times. A drawback to this approach is that the manufacturer is usually unaware of which test cycles are timing critical and which are non-critical. The manufacturer usually does not have enough background information about the application design requirements to recognize non-critical test cycles. Typically, the manufacturer must contact the designer and inquire whether a particular test is time critical. This usually becomes a time consuming process with the manufacturer having to discover non-critical test cycles without sufficient knowledge to do so.

Therefore, there exists a need to allow the designer, who has a better understanding of which test cycles are critical than the manufacturer, to eliminate certain output signals from testing during certain test cycles.

SUMMARY OF THE INVENTION

It is therefore an object of the present invention to provide the designer, instead of the manufacturer, with a method, system, and program to selectively mask IC output signals during non-critical test cycles. Another object to the present invention is to decrease test program development time, with a method, system, and program to quickly identify and mask IC output signals with short margin times during non-critical test cycles.

Additional objects, advantages, and novel features of the invention are set forth in the description which follows and will become more apparent to those skilled in the art when taken in conjunction with the accompanying drawings. The objects and advantages of the invention may be realized and attained by means of the instrumentalities and accommodations particularly pointed out in the appended claims.

To achieve the foregoing and other objects, in accordance with the purposes of the present invention, as embodied and broadly described herein, a system for selectively masking test results of output signals of an integrated circuit in accordance with the present invention comprises a user-definable mask generation specification including an output signal, a verification module for receiving the mask generation specification, and a test pattern generated in accordance with the mask generation specification by the verification module to mask a test result of the specified output signal.

The present invention may also comprise, in accordance with its object and purposes, a method comprising the operations of reading a user-definable mask specification including a first output signal; generating a first entry in a test pattern coded to mask a test result of the first output signal in accordance with the mask specification; and generating a second entry in the test pattern coded to specify an expected result of a second output signal.

DETAILED DESCRIPTION OF A PREFERRED EMBODIMENT

Figure 1:
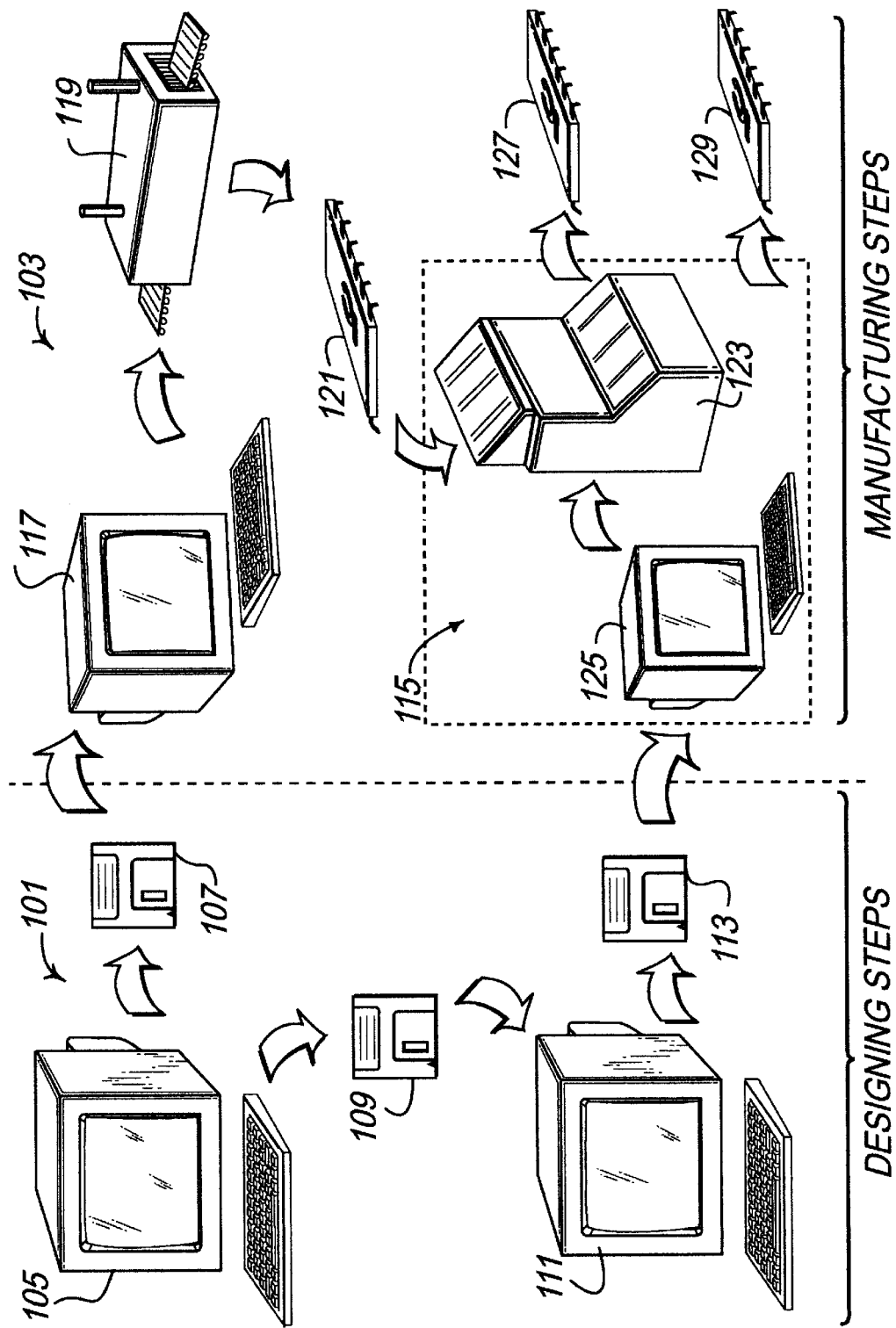
FIG. 1 depicts a separation between designing steps and manufacturing steps.
Figure 2:
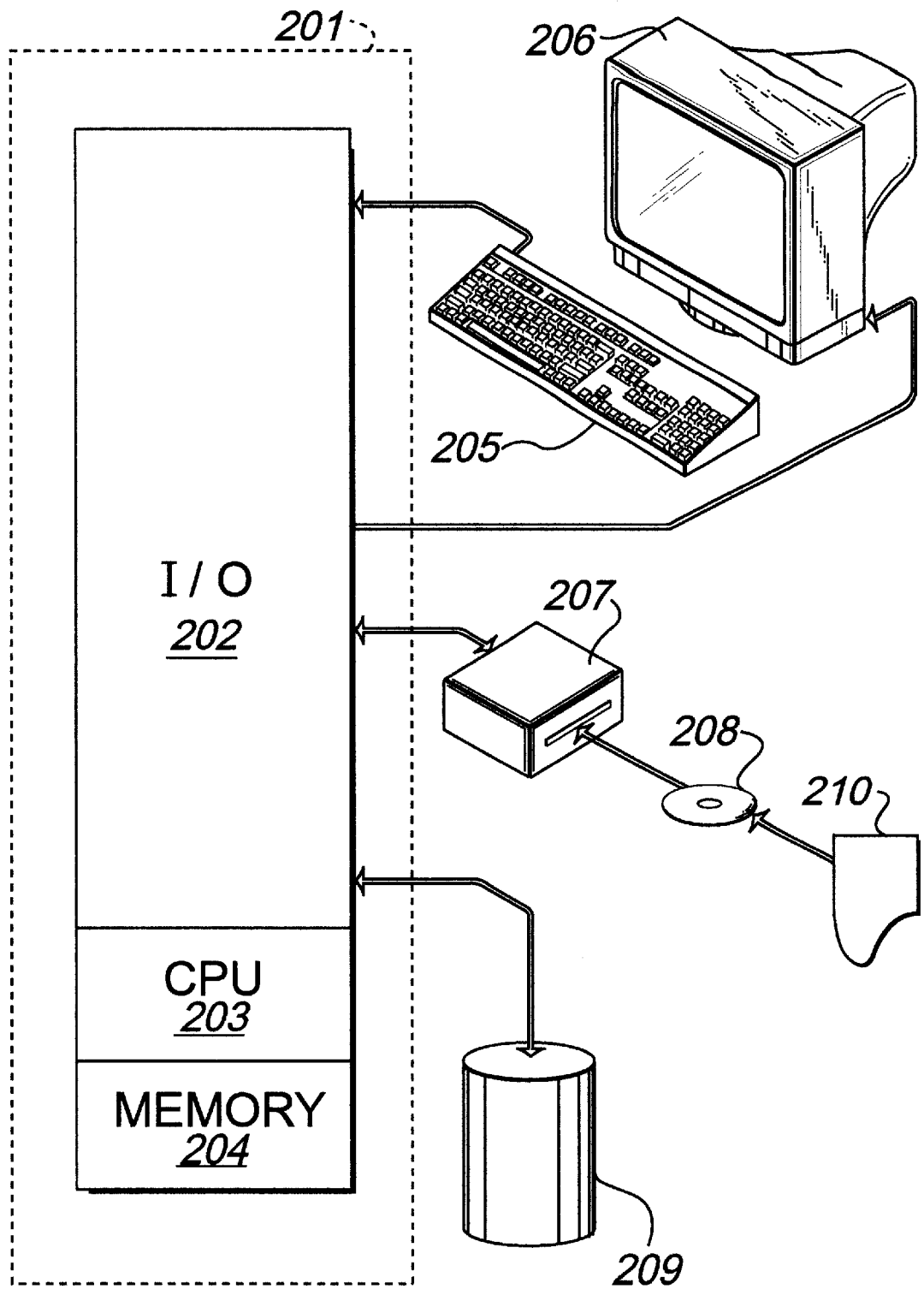
FIG. 2 depicts a general purpose computer in accordance with the present invention.

One operating environment in which the present invention is potentially useful encompasses the general purpose computer. In such a system, data and program files may be input to the computer, which reads the files and executes the programs therein. Some of the elements of a general purpose computer are shown in FIG. 2, wherein a processor 201 is shown having an input/output (I/O) section 202, a Central Processing Unit (CPU) 203, and a memory section 204. The present invention is optionally implemented in software devices loaded in memory 204 and/or stored on a configured CD-ROM 208 or storage unit 209 thereby transforming the computer system in FIG. 2 to a special purpose machine for implementing the present invention.

The I/O section 202 is connected to keyboard 205, display unit 206, disk storage unit 209, and disk drive unit 207. Generally, in contemporary systems, the disk drive unit 207 is a CD-ROM driver unit capable of reading a CD-ROM medium 208, which typically contains programs 210 and data. Computer program products containing mechanisms to effectuate the apparatus and methods in accordance with the present invention may reside in the memory section 204, on a disk storage unit 209, or on the CD-ROM medium 208 of such a system. Alternatively, disk drive unit 207 may be replaced by a floppy drive unit, a tape drive unit, or other storage medium drive unit. Examples of such systems include SPARC systems offered by Sun Microsystems, Inc., personal computers offered by IBM Corporation and by other manufacturers of IBM-compatible personal computers, and other systems running a UNIX-based or other operating system. In accordance with the present invention, simulator, verification, and extraction modules may be executed by CPU 203, and simulation output, input stimulus, mask generation file and other data may be stored on disk storage unit 209, disk drive unit 207 or other storage medium drive units coupled to the system.

Figure 3:
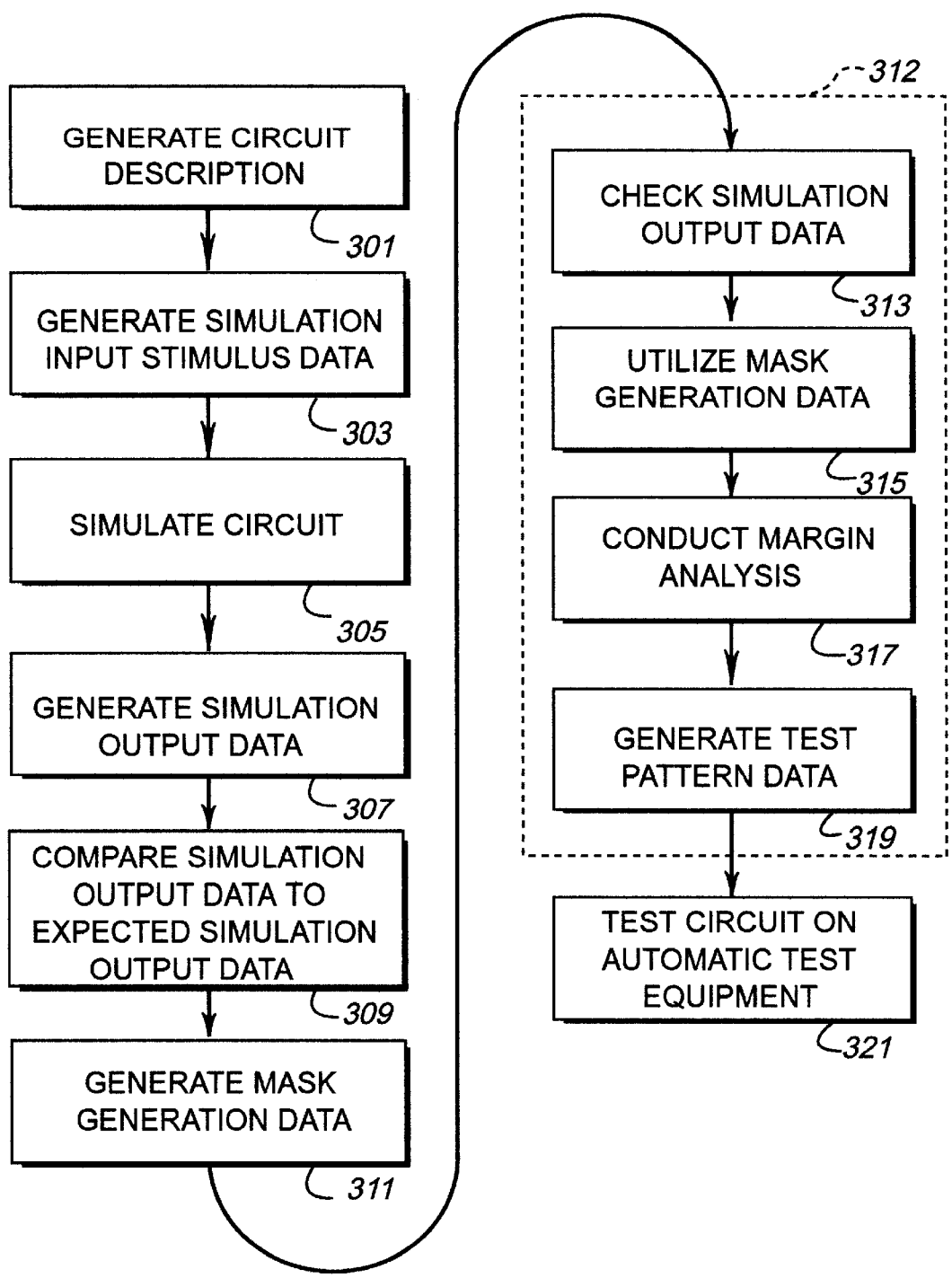
FIG. 3 is a logic diagram illustrating a method of selectively testing output signals of an IC in accordance with the present invention.

FIG. 3 illustrates a method for selectively masking output signals of an IC in accordance with the present invention. The method includes a first operation 301 of generating a circuit description of the IC. The circuit description is preferably in RTL, netlist, or design database format, however, other formats are also contemplated within the scope of the present invention.

The next operation 303 of generating simulation input stimulus data preferably creates a set of initial test conditions during circuit simulation. In a preferred embodiment, initial test conditions expressed in the input stimulus are based on anticipated real world conditions the IC will experience during operation. Input stimulus is in a format required by a particular simulator. For example, a VERILOG simulator requires that the input stimulus be in a proprietary format specified, for example, in Cadence VERILOG-XL IC 4.42 Simulation Reference Manual. Other input stimulus formats such as VHSIC Hardware Description Language (VHDL) and Verilog Hardware Description Language are also contemplated within the scope of the present invention.

The circuit description and simulation input stimulus generated in steps 301 and 303 are used in operation 305, simulating the IC. A simulator uses the circuit description to mathematically model the behavior of an IC according to the conditions set forth in the input stimulus. At operation 307, the method next includes generating simulation output data. Typically, simulation output data is automatically created by the simulator and includes the timing, state, and strength of input, output, and bi-directional signals operating during the simulation.

The simulation output data is preferably a "print-on-change" file. That is, every time a signal in the simulation changes state or strength, a new line indicating the time of a signal change during the simulation, and a state/strength value for each signal in the simulation is generated. The state/strength of a signal, for example, can include a "strong 0" ("0"—referring to a logical 0), a "strong 1" ("1"—a logical 1), a "strong low" ("L"—low resistive voltage), a "strong high" ("H"—a high resistive voltage), or a high-impedance state ("Z"—a tri-stated signal state), or a "strong X" ("X"—an unknown state), although other state/strength values are also contemplated within the scope of this invention. Furthermore, other simulation output data formats are contemplated within the scope of the present invention.

Table 1 shows an example of simulation output data. Consider a design having three input signals, I1, I2, and I3, and two output signals, O1 and O2. In a table in the header of each simulation output file, each signal is associated with a column number in the simulation output file (i.e., I1 is associated with column 1, I2 is associated with column 2, etc.). After the header, as shown in Table 1, the states and strengths of each signal at various times during the simulation are listed until the simulation is completed. The first row in the table shows the initial state/strengths of the signals. The second row shows that the I3 signal changed states from an "1" to a "0" at 3.331 ns into the simulation. The third row shows that the I2 signal changed states from a "0" to a "1" at 3.572 ns into the simulation. The fourth row shows that the O1 signal changed states from a "0" to a "X" at 6.000 ns into the simulation. The times associated with each row are based on the time of a signal state/strength change and are not dependent on a tester or simulator cycle. The data format illustrated in Table 1 is an example of data used in an embodiment of the present invention. Other simulation output data formats are also contemplated in accordance with the present invention.

TABLE 1

REPRESENTATION EXAMPLE OF SIMULATION OUTPUT DATA

| Time | I1 | I2 | I3 | O1 | O3 |
|---|---|---|---|---|---|
| 0.000 ns | 0 | 0 | 1 | 0 | 1 |
| 3.331 ns | 0 | 0 | 0 | 0 | 1 |
| 3.572 ns | 0 | 1 | 0 | 0 | 1 |
| 6.000 ns | 0 | 1 | 0 | X | 1 |

Of particular importance to the present invention is the "X" state, also called a "MASKED", or "DONT_CARE", or "UNKNOWN" state. In this state, the data on a signal is unknown or undermined and the simulator cannot predict a value for the signal. Signals will often enter an unknown state during a transition between two different know states.

Referring back to FIG. 3, the simulation output data is used in the next operation 309 of comparing simulation output data to expected output data. Generally, a designer uses simulation output data to check if an IC design is correct before constructing the IC. To this end, simulation output data is compared against expected output results created by the designer. If the simulation results do not compare favorably to the expected results, the designer returns to the previous steps and modifies the circuit description, input stimulus data, and/or expected simulation output data.

When the designer is satisfied with the results in operation 309, the method next includes generating mask generation data operation 311. In a preferred embodiment, the mask generation file includes a tester cycle time and one or more output signals. For each signal listed in the mask generation data, the pattern data is coded in operation 317 with an "X" at the associated cycle time in the test pattern data. As a result of an "X" in the test pattern data, the output signal at that test cycle will not be tested or compared by the tester.

Table 2 is illustrates an example of mask generation data. The file contains a list of tester cycles and associated signals. Each cycle-signal pair indicates the placement of an "X" in the test pattern data. According to Table 2, the O1 output signal is MASKED during the third tester cycle. Other mask generation data formats are also contemplated within the scope of the present invention. For example, mask generation data may allow the user to enter comments for each signal.

TABLE 2

REPRESENTATION EXAMPLE OF MASK GENERATION DATA

| Cycle | Signal |
|---|---|
| 3 | O1 |
| 19 | READ |
| 19 | DATA_1 |
| 56 | DATA_2 |

FIG. 3 next proceeds to verification block 312. During verification, the simulation output data is examined and test pattern data is created. The beginning operation 313 during verification includes checking the simulation output data. In a preferred embodiment, this operation ensures that the input, output, and bidirectional signal timings and formats are compatible with a targeted ATE system. Additionally, operation 3 13 may check for other errors associated with test pattern generation such as signal contention problems and other problems known to those skilled in the art.

The method next includes operation 315, utilizing mask generation data. In this operation, output signals listed in the mask generation data are coded to be masked during test cycles listed in the mask generation data. Each masked output signal is later formatted in test pattern data such that an ATE system does not test the masked output signal at the specified test cycle.

Table 3 shows a representation example of test pattern data, although other file formats are contemplated within the scope of the present invention. A test pattern preferably includes a list of tester cycles and the state of each input and output signal in the corresponding tester cycle.

TABLE 3

REPRESENTATION EXAMPLE OF TEST PATTERN DATA

| Cycle | I1 | I2 | I3 | O1 | O2 |
|---|---|---|---|---|---|
| 1 | 0 | 0 | 0 | 1 | 1 |
| 2 | 1 | 1 | 0 | 1 | X |
| 3 | 0 | 1 | 0 | Z | 1 |
| 4 | 0 | 1 | 0 | 0 | 0 |

In Table 3, each signal is associated with a column number and each test cycle has a row. The first test cycle shows the initial signal states of I1, I2, and I3 to be 0 on all three input signals. Output signals O1 and O2 are expected to be in a "1" state. Thus, during the first test cycle, the ATE will place logical "0" at all three input signals and strobe the circuit, checking for a logical "1" value at each of the output signals.

During the second test cycle, the test pattern data indicates a MASKED, UNKNOWN, or DONT_CARE signal, represented by an "X", for signal O2. In this cycle, the tester will not test the value present on signal O2. Typically, an output signal is tested by strobing its value at a strobe time within each test cycle and comparing the detected value with its expected value found in the test pattern file. When a tester reads a "X" in a test pattern, it preferably does not compare, or masks, the value of the output signal during the test-cycle indicated. Alternatively, a tester may not test or branch conditionally according to an output signal corresponding to an "X" in a particular test cycle, thereby "masking" the output value. Moreover, a masked output signal is always deemed to have passed the comparison test with its expected output value. Thus, no matter what data is actually present on the output signal, the tester continues as if the masked output signal matches the expected value, and no data error is indicated.

Referring back again to FIG. 3, utilizing mask generation data operation 315 therefore involves coding test pattern data such that output signals listed in the mask generation data are masked at the specified test cycles. Preferably, an "X" replaces the test pattern's output data corresponding to the test cycle and signal name contained in the mask generation data. For example, in Table 2, the mask generation data specifies masking output signal O1 at test cycle 3. Referring now to Table 3, extracting the mask generation data requires changing the "Z" state of O1 at cycle 3 into an "X" state.

Once the mask generation data has been utilized, the next operation 317 is conducting margin analysis to the test pattern data. Due to the hardware propagation delays and calibration errors of ATE systems, guardbands restrict the time IC output data can be strobed by the tester. Although an IC's output signals may contain valid data, the data must propagate through the ATE's components before it can be read and compared to expected output data. Margin analysis checks that the test pattern data and time sets do not violate the intended ATE system's guardband limitations and thus ensure a proper functioning test program. Furthermore, margin analysis preferably produces a margin analysis report describing the shortest margin times for each output signal in the test pattern.

The next operation 317 of generating test pattern data creates test pattern data according to information contained in the simulation output data, time sets, and mask generation data, as described above. In operation 321, the method includes testing the IC on an ATE system. A test engineer typically executes a test program, along with test pattern data and timing sets on a tester. Fabricated ICs are fed into a handler controlled by the tester. The handler sorts the ICs according to the test results from the test program.

Figure 4A:
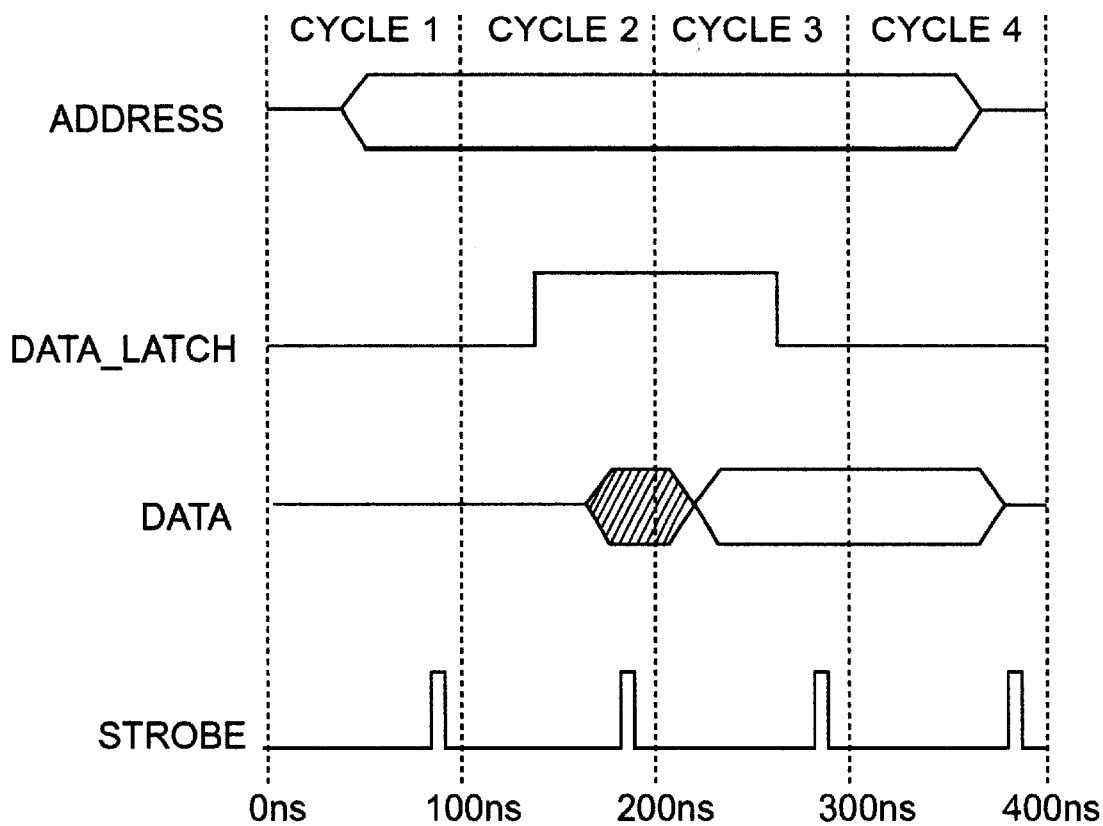
FIG. 4a shows a simulation output timing diagram for a typical IC during four test cycles.

FIG. 4a shows a simulation output timing diagram for a typical IC during four test cycles, each cycle being 100 ns in duration. The IC has input signals ADDRESS, output signals DATA_LATCH and DATA, and an active high STROBE signal, used to by a ATE system to strobe the output signals. Note that for simplicity purposes, the STROBE signal represents each output signal's individual strobe signal (not shown). During the first tester cycle, the ADDRESS signals change from a "Z" state to a valid input state of either "0" or "1" before STROBE goes high. Output signal DATA_LATCH stays low and output signal DATA stays high-Z during the first cycle. Therefore, the expected output data in the test pattern contains a logic "0" for DATA_LATCH, and a high-Z state for DATA.

During the second test cycle, DATA_LATCH changes from a logic "0" state to a logic "1" state, and DATA transitions from a "Z" state into an unknown state (represented by the cross-hatched lines). The unknown state on DATA continues into cycle 3 until a valid signal state is reached. Thus, the simulation output file for DATA contains an "X" during the unknown state interval. Moreover, since the DATA signal is in an unknown state during the second strobe interval, the test pattern file in cycle 2 will also contain an "X" or a "DONT_CARE" for the DATA signal. Therefore, the tester will mask the DATA signal and only compare the DATA_LATCH output signal to a logic "1" during the second test cycle.

Figure 4B:
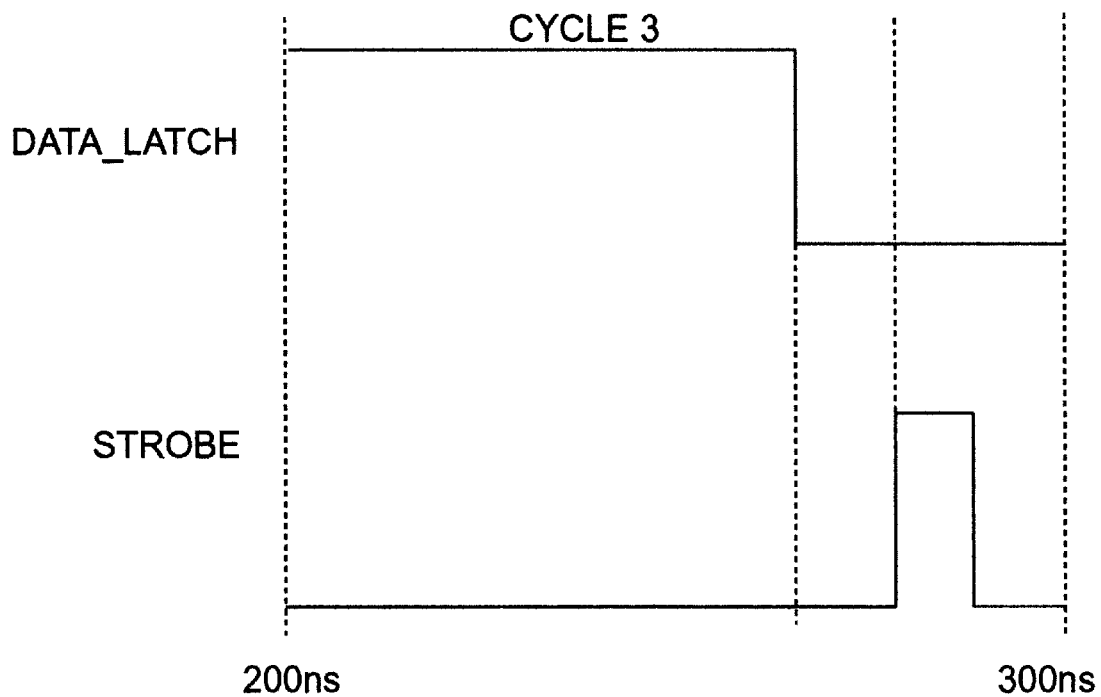
FIG. 4b shows a simulation output timing diagram for a typical IC during a third test cycle.

At test cycle 3, DATA transitions from an unknown state to a valid logic level. DATA_LATCH also transitions during this cycle from a logic "1" to a logic "0". The simulation output data contains valid logic levels for DATA and DATA_LATCH signals and will not contain an "X" state in cycle 3. Upon further examination, however, it is clear that DATA_LATCH transitions from high to low very close to STROBE going high (shown more clearly in FIG. 4b). Thus, in test cycle 3, DATA_LATCH has a small positive left margin time. If DATA_LATCH's transition is not time critical, the designer may wish to mask this signal even though simulation and verification indicate a DATA_LATCH is in a testable state during strobe. A slight delay in DATA_LATCH's transition time will cause the IC to fail during a non-critical operation.

According to the present invention, the designer masks DATA_LATCH during the third test cycle by generating mask generation which includes test cycle 3 and output signal DATA_LATCH. The mask generation data is then extracted and a "X" state is placed in the test pattern data during cycle 3 for output signal DATA_LATCH. During testing, the ATE system will therefore mask DATA_LATCH at test cycle 3.

Figure 5:
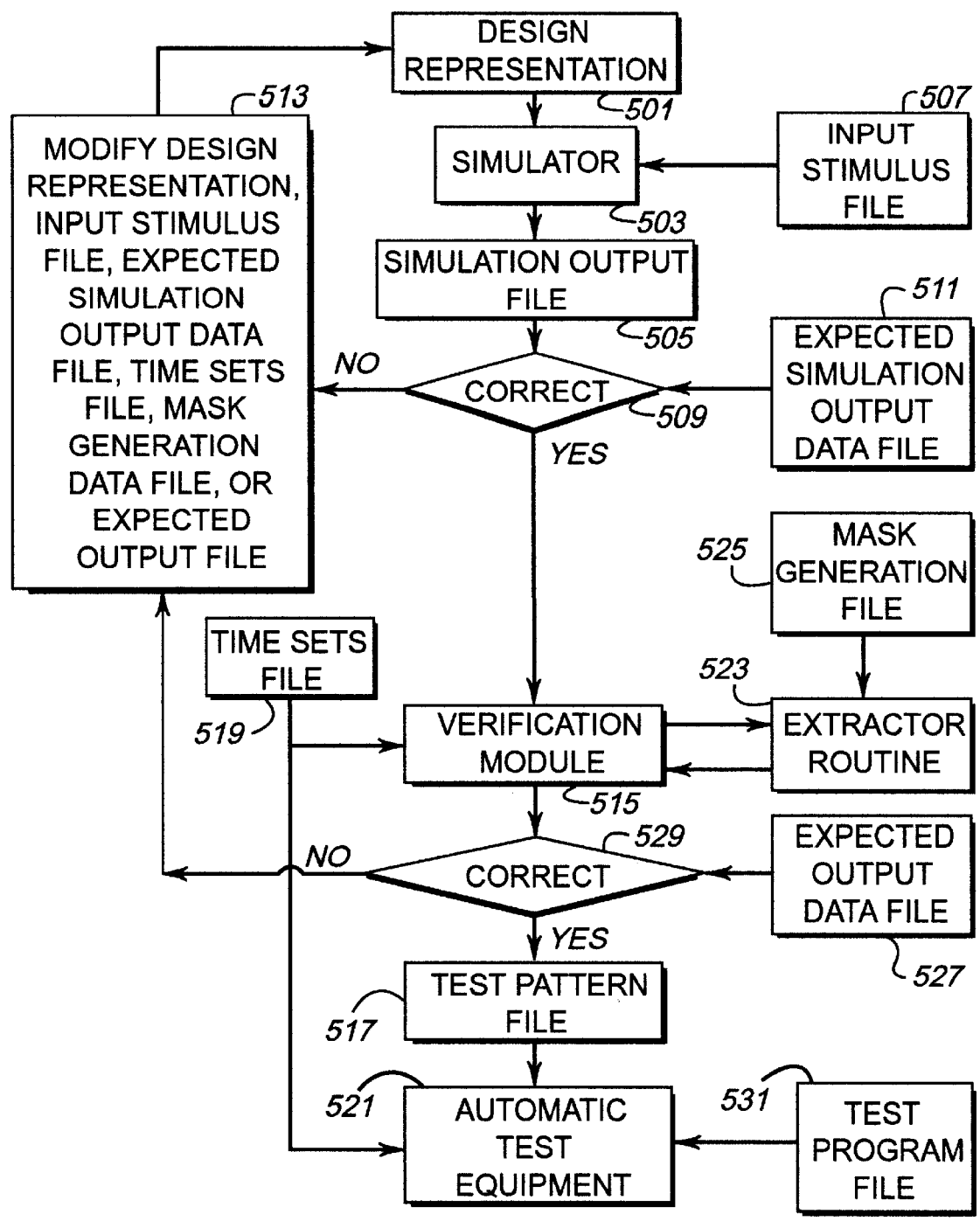
FIG. 5 is a flow diagram illustrating a process in selectively testing output signals of an IC in accordance with the present invention.

FIG. 5 illustrates an exemplary IC design process in accordance with the present invention. Circuit design representation 501 is simulated in a simulator 503 to produce a simulation output file 505. Input stimulus 507 is input to the simulator 503 to specify the input signals used during the simulation.

Decision block 509 checks the simulation results to determine whether the design simulates as expected, as compared with a set of expected results provided by the designer from expected simulation output data file 511. If, as determined in decision block 509, the results are not correct, the designer modifies the design, the input stimulus, and/or the expected results in block 5 13 and re-simulates the design with the modifications. This process is repeated iteratively until the simulation results satisfy the expected output simulation output data file 511, at which point the process proceeds to verification module 515 which receives the simulation output file 505 provided by the simulator 503.

Verification module 515 processes the simulation output data 505 to produce a tester-cycle-based test pattern file 517. It also ensures that the resulting test pattern file 5 17 and time sets 519 are compatible with the targeted ATE system 521. For example, the verification module 515 conducts a margin analysis check to ensure the time sets 519 and test pattern file 517 do not violate tester guardband limitations.

The verification module 515 calls an extractor routine 523. The extractor routine 523 replaces expected output data in the test pattern file 517 with an "X" state or a DONT_CARE code indicating a signal mask according to the information contained in a mask generation file 525. The mask generation file 525 lists output data signals to be masked at specified test cycle times by the ATE system 521. The extractor tool 323, after masking the output signals listed in the mask generation file 525, then returns control to the verification module 515 for further signal analysis and testing.

The results from the verification module 515 are compared to expected data file 527 in decision block 529. If the results do not conform to the designer's requirements, he or she may modify the design representation 501, input stimulus file 507, expected output data file 527, time sets 519, and/or mask generation file 525 as indicated in block 513 until the desired results are achieved. After the designer is satisfied with the test pattern file 517 generated, it is loaded into the ATE system 521, along with time sets 519 and test program file 531 for IC testing.

Figure 6:
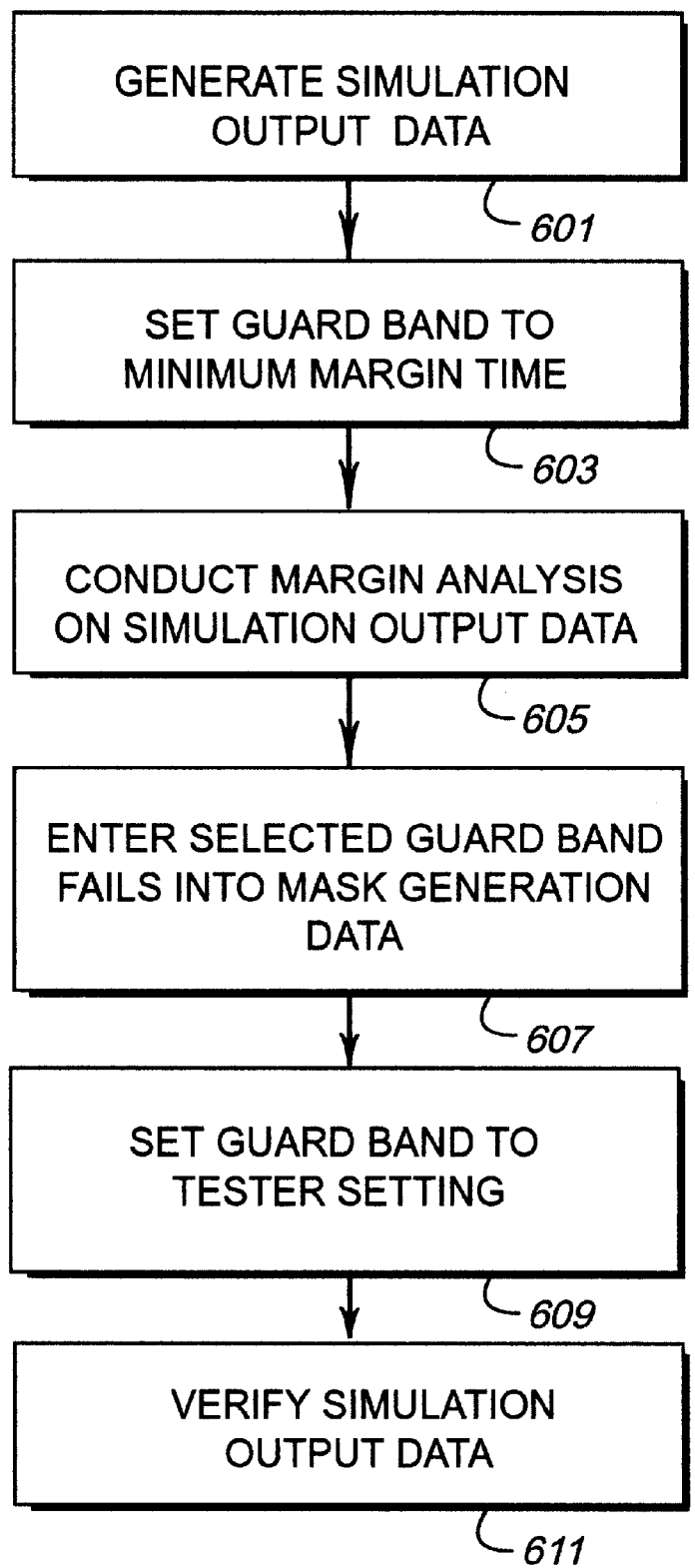
FIG. 6 is a logic diagram illustrating an alternate embodiment method of generating mask generation data in accordance with the present invention.

FIG. 6 is a logic diagram illustrating an alternate embodiment method of generating mask generation data in accordance with the present invention. After the designer has finished a generating simulation output data operation 601, the next operation 603 of setting a tester guardband to a minimum margin time is performed. Preferably, the minimum margin time is set large enough so that IC time drifts due to process variations will not significantly affect manufacturing yields. For example, the minimum margin time is set greater than a critical test cycle margin time and less than a non-critical test cycle margin time. This way, any test cycles containing a small margin time will fail margin analysis and will be reported to the designer.

The next operation 605 is conducting margin analysis on the simulation output data. The margin analysis generates a margin analysis report detailing output signals and test cycles with margin times less than the minimum margin time. The designer, being aware of which test cycles are critical and which are not, performs the next operation 607 of selectively entering those signal-cycle pairs listed in the margin analysis report which are non-critical test cycles into mask generation data.

Once the mask generation data is entered, the tester guardband set back to the normal tester setting in the next operation 609. The simulation output data is then verified in the following operation 611. As described previously, the verifying operation includes extracting mask generation data and generating a test pattern with output signals masked during the test cycles specified in the mask generation data.

Thus, the present invention enables designers to identify and mask output signals with small margin times during non-critical test cycles quickly and efficiently. While the invention has been particularly shown and described with reference to a preferred embodiment thereof, it will be understood by those skilled in the art that various other changes in the form and details may be made without departing from the spirit and scope of the invention.

A presently preferred embodiment of the present invention and many of its improvements have been described with a degree of particularity. It should be understood that this description has been made by way of example, and that the invention is defined by the scope of the following claims.

What is claimed is:

1. A method for selectively testing an output signal of an integrated circuit, said method comprising:
   receiving a user-definable mask generation specification including said output signal;
   converting expected results of said integrated circuit into a test pattern;
   coding said test pattern to mask said output signal in accordance with said mask generation specification;
   testing said integrated circuit in accordance with said coded test pattern; and
   masking a result of said testing operation corresponding to said output signal.

2. The method of claim 1 further comprising producing a margin report based on said coded test pattern.

3. The method of claim 1 wherein said mask generation specification further includes a cycle in which to mask said output signal.

4. The method of claim 3 wherein the operation of coding said test pattern comprises coding a test pattern entry corresponding to said output signal and said cycle in accordance with said mask generation specification.

5. The method of claim 3 wherein the operation of masking said result comprises masking said result of said testing operation corresponding to said output signal and said cycle.

6. The method of claim 1 wherein the operation of coding said test pattern comprises coding said output signal with a mask code.

7. The method of claim 1 wherein the operation of inputting a mask generation specification further comprises:
   specifying a minimum strobe margin setting;
   selecting said output signal having a strobe margin less than said minimum strobe margin setting; and
   recording said output signal in a mask generation specification.

8. The method of claim 7 wherein the operation of selecting said output signal further comprises:
   conducting a margin analysis based on said output signal; and
   selecting said output signal during a cycle having a strobe margin less than said minimum strobe margin setting based on a margin analysis report.

9. The method of claim 7 wherein said minimum strobe margin setting is greater than a testing system guardband specification.

10. A method of generating a test pattern to mask a first output signal during testing, said method comprising:
    reading a user-definable mask generation specification including said first output signal;
    generating a first entry in said test pattern coded to mask a test result of said first output signal in accordance with said mask generation specification; and
    generating a second entry in said test pattern coded to specify an expected result of a second output signal.

11. The method of claim 10 wherein said mask generation specification further includes a cycle during which said first output signal is masked.

12. The method of claim 11 wherein said first entry in said test pattern is coded to mask a test result of said first output signal at said cycle.

13. The method of claim 10 wherein the operation of generating said first entry comprises coding said first entry with a mask code.

14. The method of claim 10 wherein said mask generation specification further includes a comment section.

15. The method of claim 14 wherein said minimum strobe margin setting is greater than a testing system guardband specification.

16. The method of claim 10 wherein the operation of reading a user-definable specification further comprises:
    specifying a minimum strobe margin setting;
    selecting a first output signal having a strobe margin less than said minimum strobe margin setting; and
    recording said first output signal in a user-definable mask generation specification.

17. The method of claim 16 wherein the operation of selecting said first output signal further comprises:
    conducting a margin analysis based on said first output signal; and
    selecting said first output signal during a cycle having a strobe margin less than said minimum strobe margin setting based on a margin analysis report.

18. The method of claim 10 further comprising the operation of producing a margin report based on said coded test pattern.

19. A system for selectively masking test results of output signals of an integrated circuit, said system comprising:
    a user-definable mask generation specification including an output signal;
    a verification module for receiving said mask generation specification; and a test pattern generated in accordance with said mask generation specification by said verification module to mask a test result of said specified output signal.

20. The system of claim 19 wherein said generation specification further includes a cycle during which said output signal is to be masked.

21. The system of claim 19 wherein said test pattern is further generated in accordance with said mask generation specification to mask said test result of said output signal at said cycle.

22. A program storage medium, readable by a computer, tangibly embodying a program of instructions executable by said computer for generating a test pattern to mask a first output signal during testing, the program comprising instructions for:

reading a user-definable mask generation specification including said first output signal;

generating a first entry in said test pattern coded to mask a test result of said first output signal in accordance with said mask generation specification; and generating a second entry in said test pattern coded to specify an expected result of a second output signal.

* * * * *